(12) United States Patent
Chang et al.

(10) Patent No.: US 10,808,726 B2
(45) Date of Patent: Oct. 20, 2020

(54) FAN STRUCTURE

(71) Applicant: ASIA VITAL COMPONENTS CO., LTD., New Taipei (TW)

(72) Inventors: Bor-Haw Chang, New Taipei (TW); Yu-Tzu Chen, New Taipei (TW); Chung-Shu Wang, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 182 days.

(21) Appl. No.: 15/494,555

(22) Filed: Apr. 24, 2017

(65) Prior Publication Data
US 2018/0306207 A1    Oct. 25, 2018

(51) Int. Cl.
| | | |
|---|---|---|
| *B63H 1/26* | (2006.01) | |
| *F04D 29/66* | (2006.01) | |
| *F04D 29/52* | (2006.01) | |
| *F04D 25/08* | (2006.01) | |
| *F04D 29/38* | (2006.01) | |
| *H01L 23/467* | (2006.01) | |

(52) U.S. Cl.
CPC .......... *F04D 29/663* (2013.01); *F04D 25/08* (2013.01); *F04D 29/384* (2013.01); *F04D 29/526* (2013.01); *F04D 29/522* (2013.01); *F05B 2260/96* (2013.01); *F05D 2260/96* (2013.01); *H01L 23/467* (2013.01)

(58) Field of Classification Search
CPC . F01D 11/08; F01D 5/20; F01D 5/143; F04D 29/526; F04D 29/547

USPC ........ 415/119, 173.1, 173.3, 208.2; 416/189, 416/228; 417/423.1
See application file for complete search history.

(56) References Cited

U.S. PATENT DOCUMENTS

| | | | | |
|---|---|---|---|---|
| 3,680,977 A | * | 8/1972 | Rabouyt | B64C 11/001 415/173.6 |
| 3,842,902 A | * | 10/1974 | Poslusny | F01D 11/08 123/41.49 |
| 4,354,801 A | * | 10/1982 | LaBaire | F04D 25/045 415/119 |
| 4,949,022 A | * | 8/1990 | Lipman | H02K 7/14 318/400.08 |
| 5,730,583 A | * | 3/1998 | Alizadeh | F04D 19/002 416/169 A |
| 5,979,541 A | * | 11/1999 | Saito | H01L 23/467 165/122 |

(Continued)

*Primary Examiner* — Long T Tran
*Assistant Examiner* — James J Kim
(74) *Attorney, Agent, or Firm* — Demian K. Jackson; Jackson IPG PLLC

(57) ABSTRACT

A fan structure includes a frame body and a fan impeller. The frame body has a base seat and an annular wall. A bearing cup upward extends from a center of the base seat. At least one groove is annularly formed on inner wall face of the annular wall. The fan impeller is pivotally disposed in the bearing cup and has a hub and multiple blades outward extending from the hub. Each blade has an end edge. At least one protrusion section outward protrudes from the end edge into the groove. According to the design of the fan structure, the protrusion section can destroy the production of the vortex of the blade of the conventional fan so as to greatly minify the strength of the vortex. Therefore, the structure of the sound field of the vortex is changed so that the noise of the fan structure is lowered.

8 Claims, 17 Drawing Sheets

(56) References Cited

U.S. PATENT DOCUMENTS

| | | | | |
|---|---|---|---|---|
| 6,024,537 | A * | 2/2000 | Moreau | F04D 29/326 |
| | | | | 416/169 A |
| 6,619,385 | B2 * | 9/2003 | Watanabe | H01L 23/467 |
| | | | | 165/121 |
| 8,091,177 | B2 * | 1/2012 | Cote | F04D 29/329 |
| | | | | 16/203 |
| 9,234,521 | B2 * | 1/2016 | Liu | F04D 25/0613 |
| 2007/0160468 | A1 * | 7/2007 | Tsubota | F01P 5/06 |
| | | | | 415/173.6 |
| 2012/0134798 | A1 * | 5/2012 | Tang | F04D 25/0613 |
| | | | | 415/213.1 |
| 2015/0125283 | A1 * | 5/2015 | Chang | F04D 25/0613 |
| | | | | 415/200 |

* cited by examiner

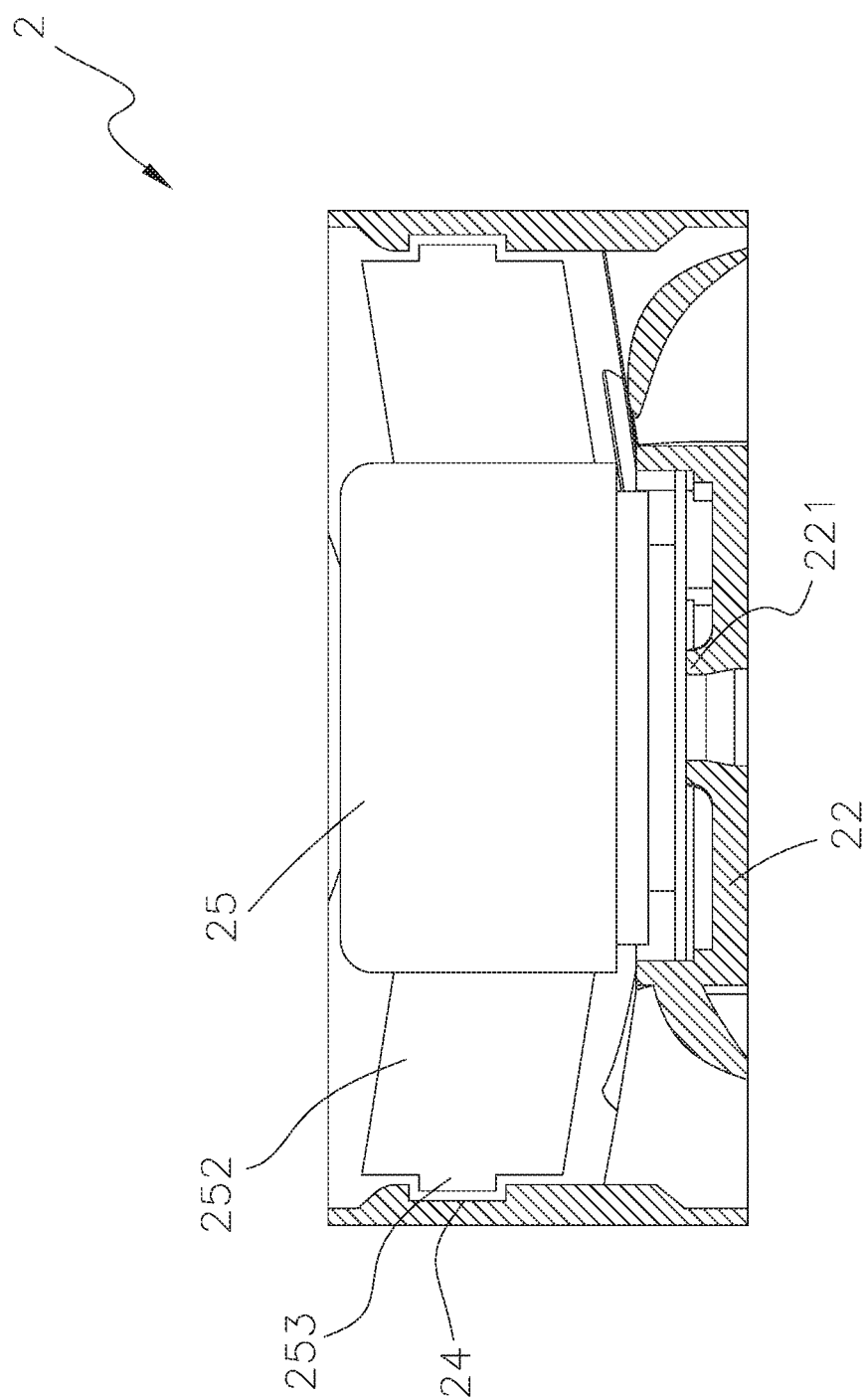

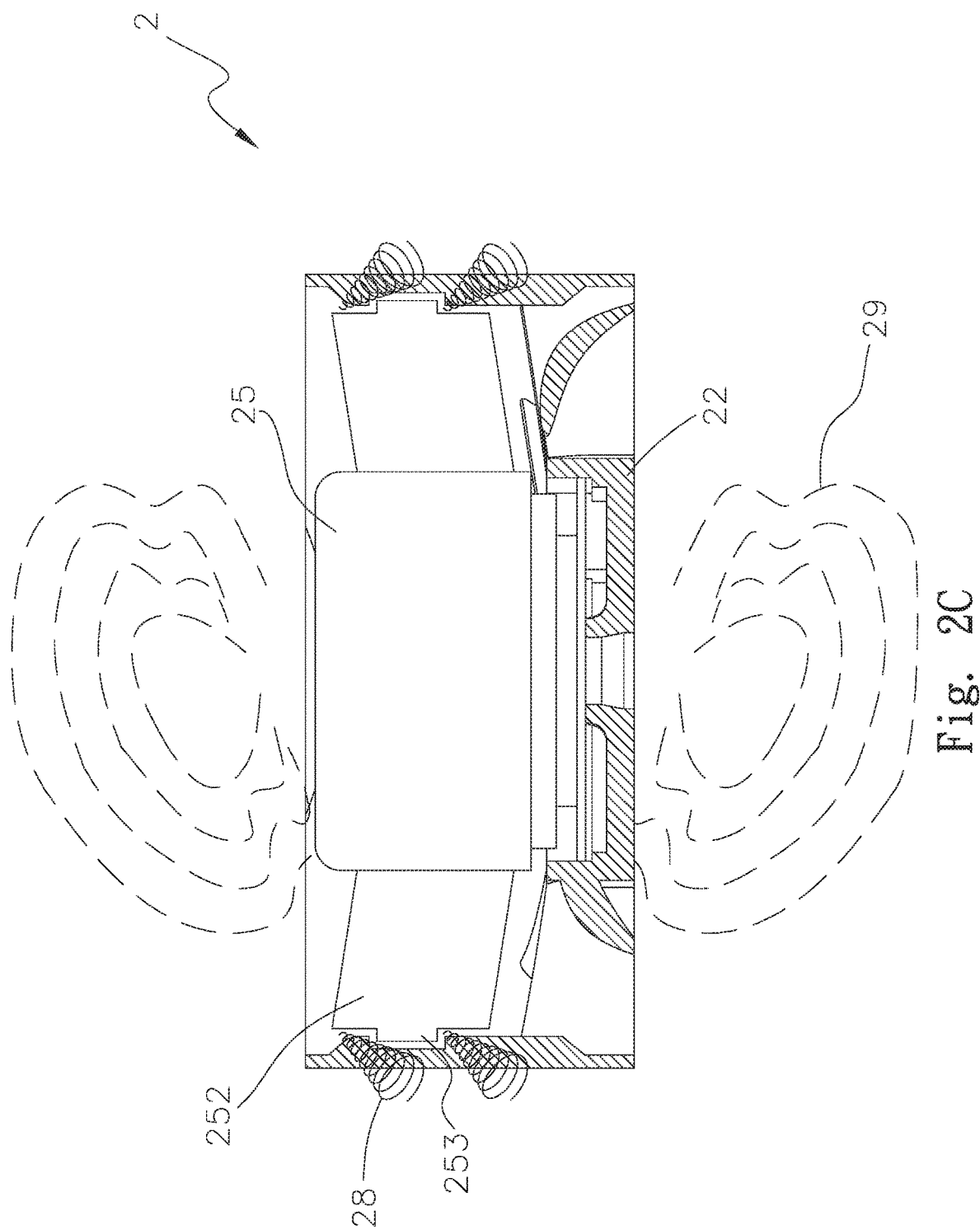

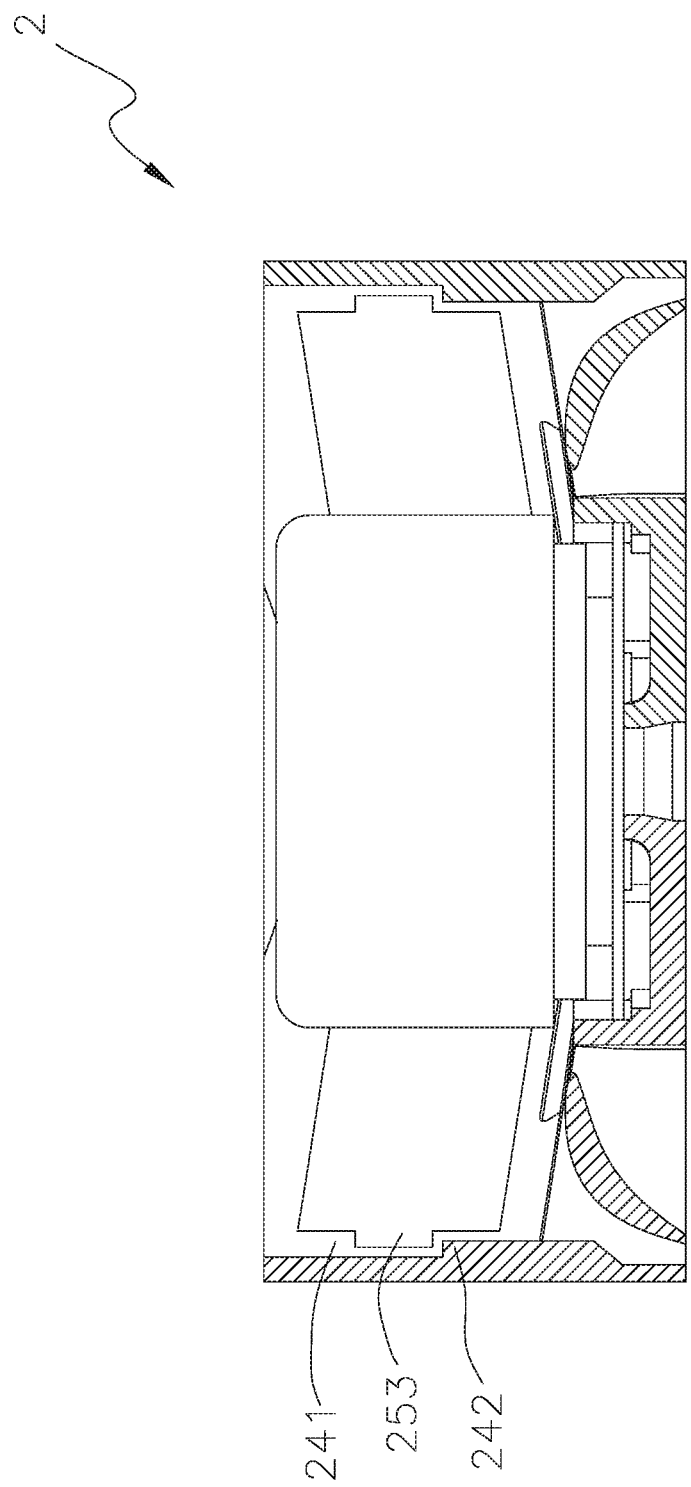

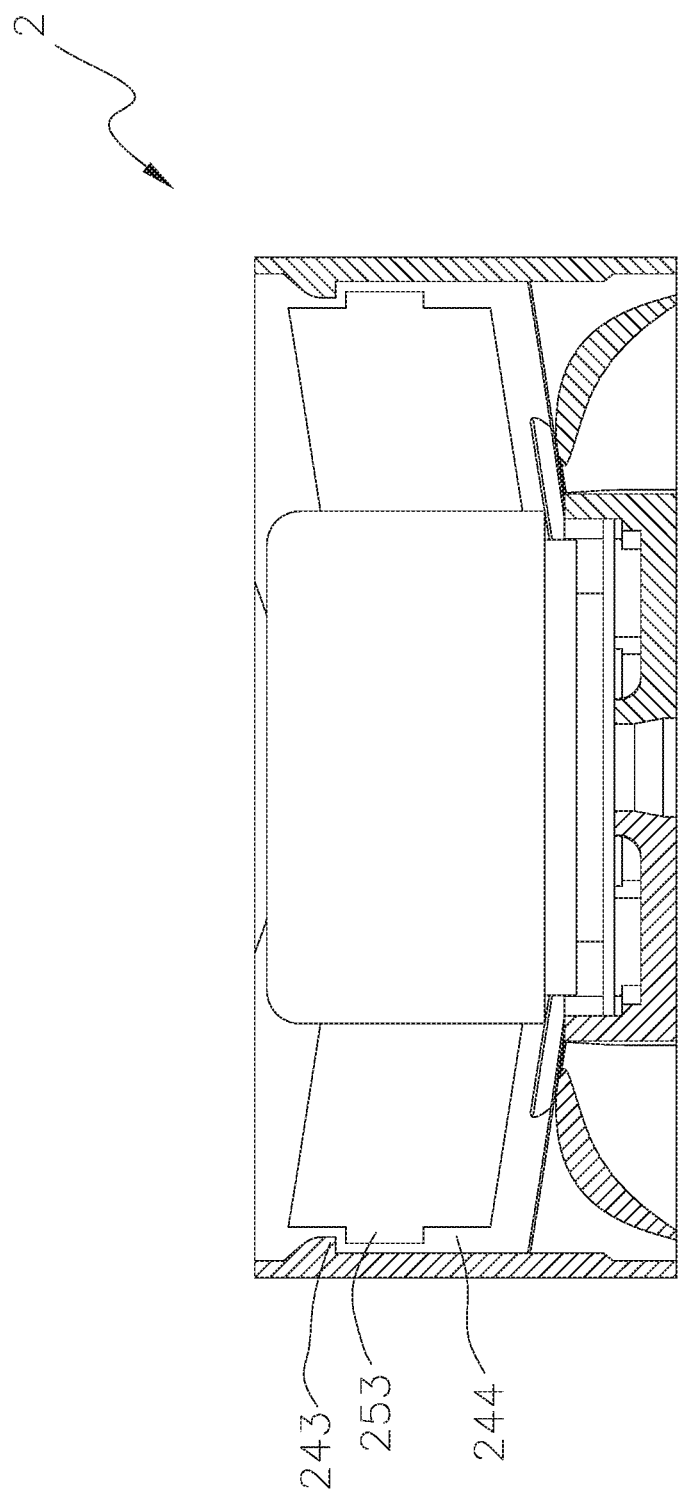

FAN STRUCTURE

BACKGROUND OF THE INVENTION

1. Field of the Invention

The present invention relates generally to a fan structure, and more particularly to a fan structure, which can destroy the production of the vortex of the blade of the conventional fan so as to greatly minify the strength of the vortex. Therefore, the structure of the sound field of the vortex is changed so that the noise of the fan structure is lowered.

2. Description of the Related Art

Along with the continuous advance of science and technologies, the dependence of peoples on various electronic apparatuses has more and more increased. In operation, the internal components of the electronic products (such as computers and notebooks) will generate high heat. The heat generated by the internal components must be conducted outside the electronic product in time. Otherwise, the electronic product will overheat. In general, a fan is disposed in the electronic product to dissipate the heat and keep the electronic product operating at an operation temperature within a certain range.

Please refer to FIG. 1. The conventional fan structure 1 includes a frame body 10 and a fan impeller 11. The frame body 10 has a base seat 101 and an annular wall 102. A bearing cup 103 upward extends from the center of the base seat 101. The fan impeller 11 is correspondingly pivotally disposed on the bearing cup 103. The fan impeller 11 has a hub 111 and multiple blades 112. Each blade 112 has an upper surface and a lower surface. A gap 12 is defined between the annular wall 102 and the blades 112. According to Bernoulli's principle, when the conventional fan structure 1 operates, the airflow pressure under the lower surface is higher than the airflow pressure on the upper surface. Therefore, the airflow will upward turn over and flow from the lower surface to the upper surface. At this time, a large-area vortex 13 is produced in the gap 12 between the annular wall 102 and the blades 112. The vortex 13 will interact with the frame body 10 to make the fan make loud noise.

According to the above, the conventional fan structure has the following shortcomings:

1. A larger vortex is produced.
2. The entire fan will make loud noise.

It is therefore tried by the applicant to provide a fan structure, which can destroy the production of the vortex of the blade of the conventional fan so as to greatly minify the strength of the vortex. Therefore, the structure of the sound field of the vortex is changed so that the noise of the fan structure is lowered.

SUMMARY OF THE INVENTION

It is therefore a primary object of the present invention to provide a fan structure, which can destroy the production of the vortex of the blade of the conventional fan.

It is a further object of the present invention to provide the above fan structure, which can greatly minify the strength of the vortex of the blade of the conventional fan.

It is still a further object of the present invention to provide the above fan structure, which can change the structure of the sound field of the vortex so as to lower the noise of the entire fan structure.

To achieve the above and other objects, the fan structure of the present invention includes a frame body and a fan impeller. The frame body has a base seat and an annular wall. A bearing cup upward extends from a center of the base seat. At least one groove is annularly formed on inner wall face of the annular wall. The fan impeller is pivotally disposed on the bearing cup. The fan impeller has a hub and multiple blades outward extending from the hub. Each blade has an end edge. At least one protrusion section outward protrudes from the end edge into the groove.

The blade has an upper surface and a lower surface.

According to the structural design of the present invention, by means of the protrusion section formed on the end edge of the blade, according to Bernoulli's principle, when the fan structure operates, the airflow pressure under the lower surface is higher than the airflow pressure on the upper surface. Therefore, the airflow will upward turn over and flow from the lower surface to the upper surface. Due to the pressure difference between the upper and lower surfaces, a vortex will be produced. At this time, the structure of the protrusion section will destroy the production of the large vortex of the blade of the conventional fan. In other words, by means of the structure of the protrusion section, the strength of the vortex will be greatly minified to form smaller vortex. The interaction between the vortex and the frame body is one of the sources of the noise of the fan structure. Therefore, the large vortex is destroyed by the protrusion section to form small vortex so that the strength of the vortex is weakened. As a result, the interaction between the vortex and the frame body is weakened to lower the noise. The structure of the sound field of the vortex is changed so that the noise of the entire fan structure is greatly lowered.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 2B is a sectional view of the first embodiment of the fan structure of the present invention;

FIG. 2C is a sectional view of the first embodiment of the fan structure of the present invention, showing the change of the sound field of the noise;

FIG. 7 is a sectional view of a sixth embodiment of the fan structure of the present invention;

FIG. 8 is a sectional view of a seventh embodiment of the fan structure of the present invention;

DETAILED DESCRIPTION OF THE PREFERRED EMBODIMENTS

Figure 1:
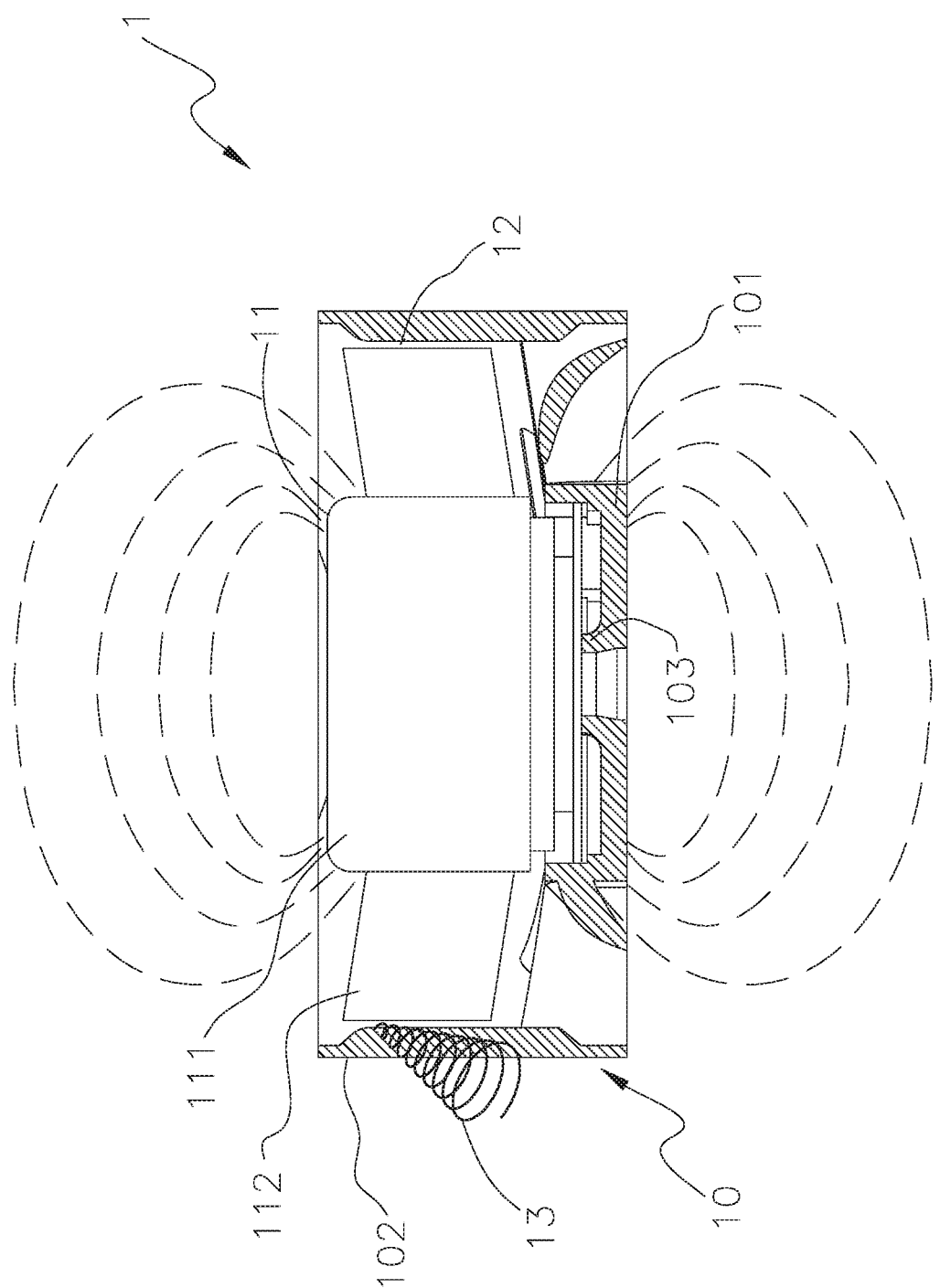
FIG. 1 is a sectional view of a conventional fan structure, showing the sound field of the noise.
Figure 2A:
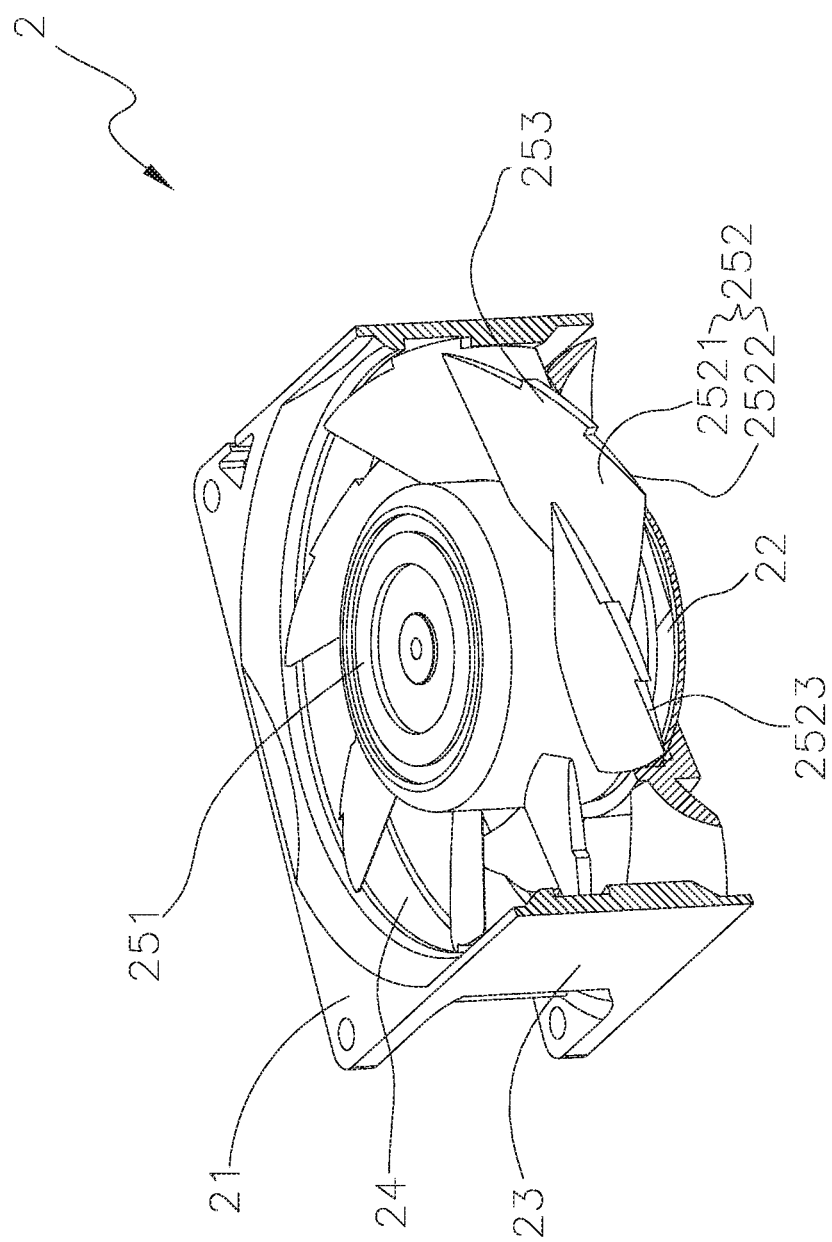
FIG. 2A is a perspective sectional view of a first embodiment of the fan structure of the present invention.
Figure 2D:
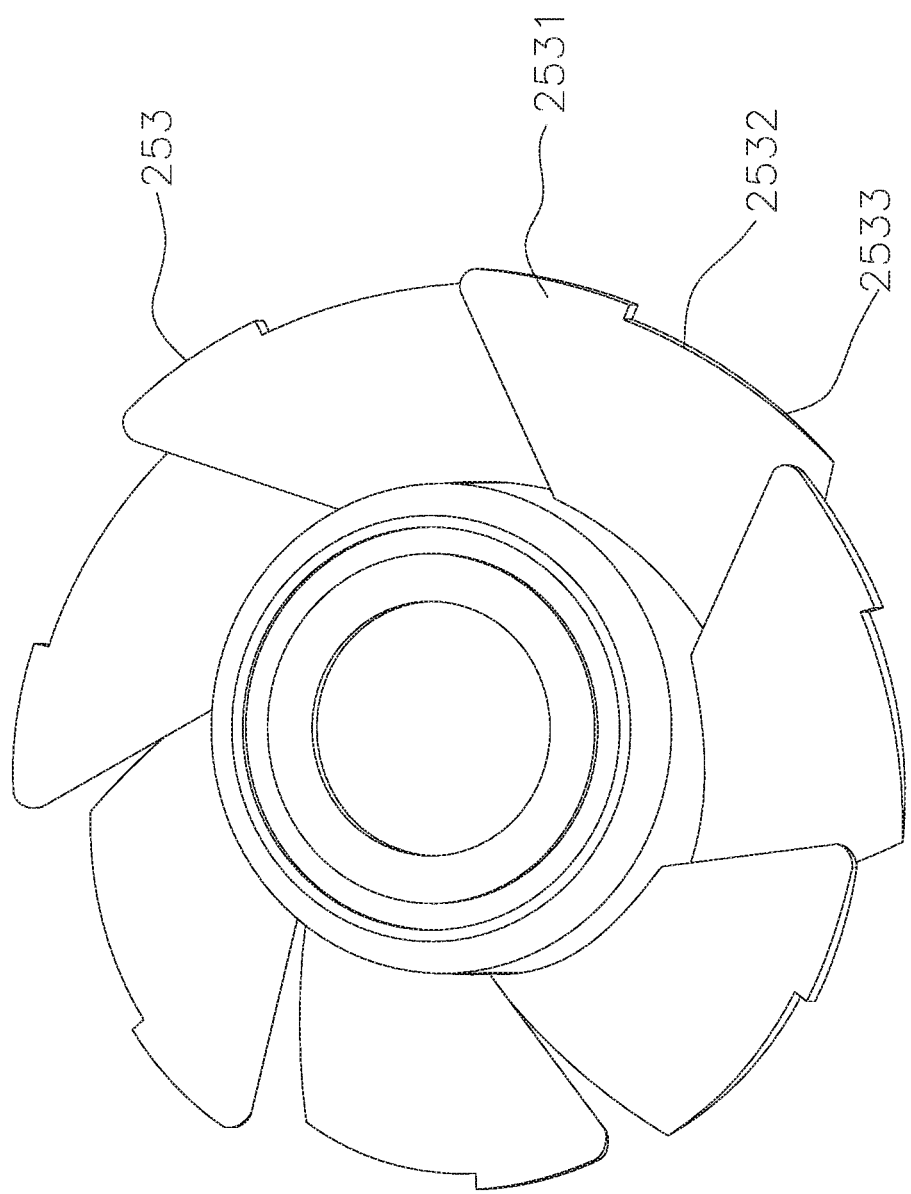
FIG. 2D is a top view of the first embodiment of the fan structure of the present invention.

Please refer to FIGS. 2A, 2B, 2C and 2D. FIG. 2A is a perspective sectional view of a first embodiment of the fan structure of the present invention. FIG. 2B is a sectional view of the first embodiment of the fan structure of the present invention. FIG. 2C is a sectional view of the first embodiment of the fan structure of the present invention, showing the change of the sound field of the noise. FIG. 2D is a top view of the first embodiment of the fan structure of the present invention. According to the first embodiment, the fan structure 2 of the present invention includes a frame body 21 and a fan impeller 25. The frame body 21 has a base seat 22 and an annular wall 23. A bearing cup 221 upward extends from the center of the base seat 22. At least one groove 24 is formed on inner wall face of the annular wall 23. In this embodiment, the groove 24 is annularly integrally formed on the inner wall face of the annular wall 23 by injection molding.

Figure 3:
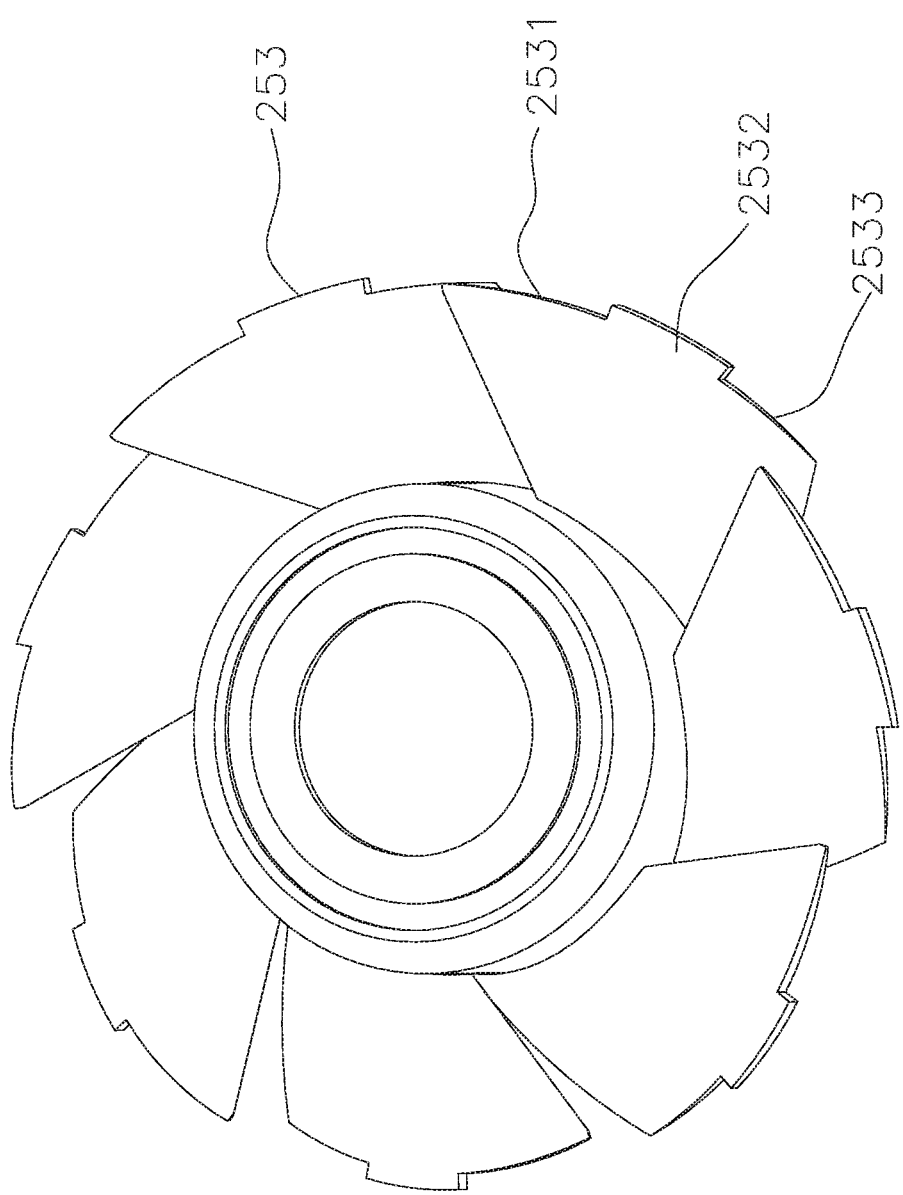
FIG. 3 is a top view of a second embodiment of the fan structure of the present invention.
Figure 4:
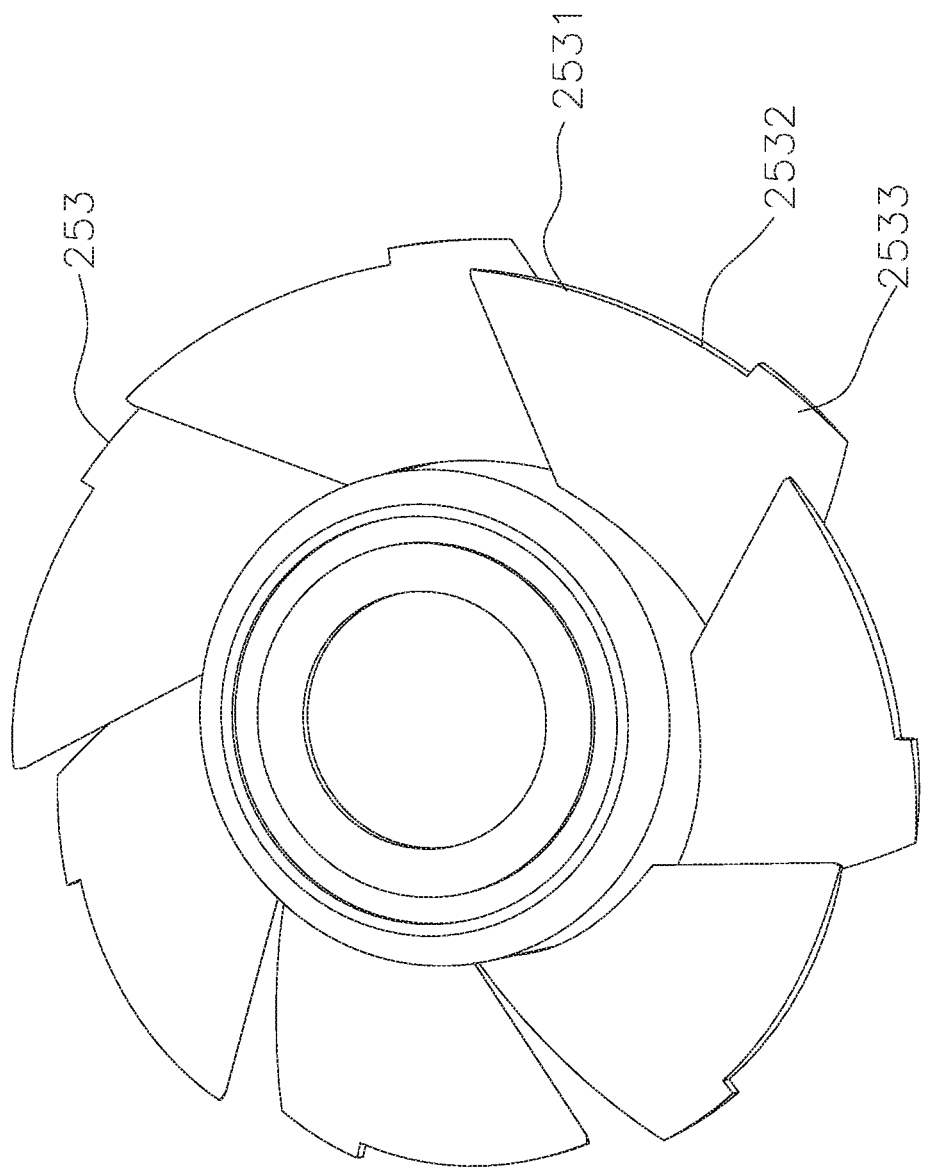
FIG. 4 is a top view of a third embodiment of the fan structure of the present invention.

The fan impeller 25 is correspondingly pivotally disposed on the bearing cup 221. The fan impeller 25 has a hub 251 and multiple blades 252 outward extending from the circumference of the hub 251. Each blade 252 has an end edge 2523. At least one protrusion section 253 correspondingly outward protrudes from the end edge 2523 into the groove 24. The end edge 2523 of the blade 252 has a front end section 2531, a middle end section 2532 and a rear end section 2533. In this embodiment, the protrusion section 253 is, but not limited to, formed on the front end section 2531 for illustration purposes only. In practice, the position of the protrusion section 253 can be adjusted according to the user's requirement. In other words, the protrusion section 253 can be alternatively formed on the middle end section 2532 (as shown in FIG. 3) or the rear end section 2533 (as shown in FIG. 4).

Figure 5:
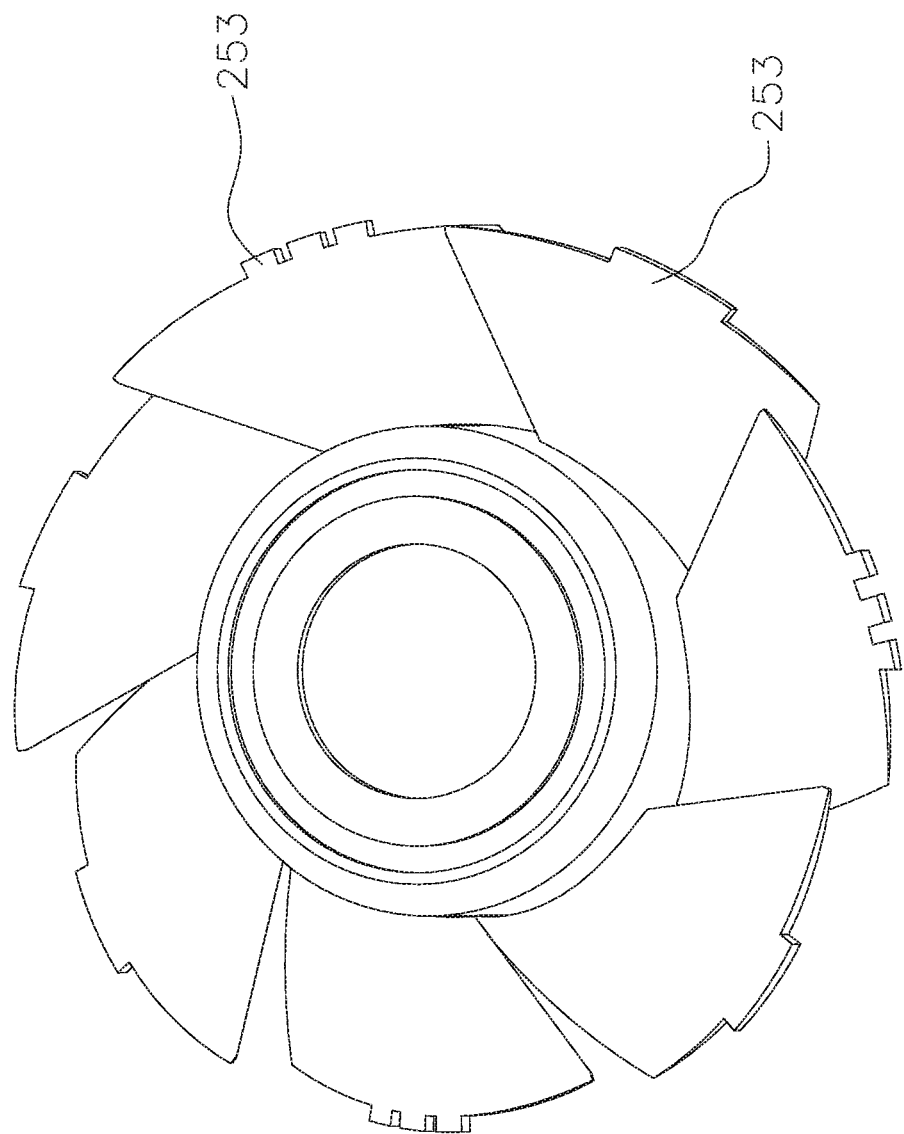
FIG. 5 is a top view of a fourth embodiment of the fan structure of the present invention.

In this embodiment, the protrusion section 253 is, but not limited to, formed with a wing shape. In practice, the shape of the protrusion section 253 can be adjusted according to the user's requirement. In other words, the protrusion section 253 can be alternatively formed with a saw-tooth shape or arched shape or flat-plate shape or a combination of these shapes (as shown in FIG. 5). In addition, the blade 252 has an upper surface 2521 and a lower surface 2522.

According to the structural design of the present invention, by means of the protrusion section 253 formed on the end edge 2523 of the blade 252, according to Bernoulli's principle, when the fan structure 2 operates, the airflow pressure under the lower surface 2522 is higher than the airflow pressure on the upper surface 2521. Therefore, the airflow will naturally upward turn over and flow from the lower surface 2522 to the upper surface 2521. Due to the pressure difference between the upper and lower surfaces 2521, 2522, a vortex 28 will be produced. At this time, the structure of the protrusion section 253 will destroy the production of the large vortex 28 of the blade of the conventional fan. In other words, by means of the structure of the protrusion section 253, the strength of the vortex 28 will be greatly minified to form smaller vortex 28.

The interaction between the vortex 28 and the frame body 21 is one of the sources of the noise of the fan structure 2. Therefore, the large vortex 28 is destroyed by the protrusion section 253 to form small vortex or micro-vortex 28 so that the strength of the vortex 28 is weakened. As a result, the interaction between the vortex 28 and the frame body 21 is weakened to greatly lower the noise. The structure of the sound field 29 of the vortex 28 is changed so that the noise of the entire fan structure 2 is greatly lowered.

Figure 6:
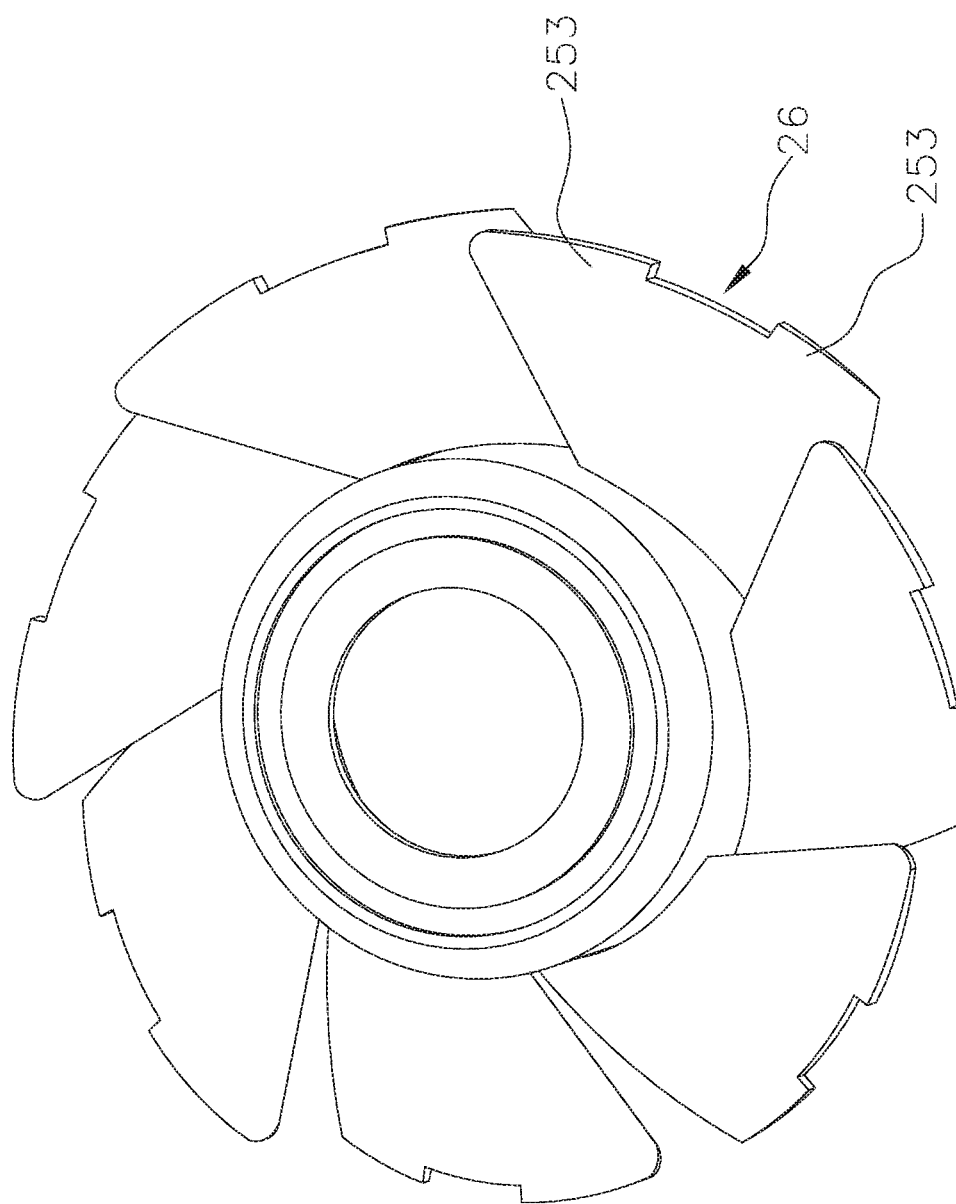
FIG. 6 is a top view of a fifth embodiment of the fan structure of the present invention.

Please now refer to FIG. 6 as well as FIG. 2D. FIG. 6 is a top view of a fifth embodiment of the fan structure of the present invention. The fifth embodiment is partially identical to the first embodiment in component and relationship between the components and thus will not be repeatedly described hereinafter. The fifth embodiment is mainly different from the first embodiment in that there are two protrusion sections 253, which are respectively formed on the front end section 2531 and rear end section 2533 of the end edge 2523. A gap 26 is defined between each two protrusion sections 253. The gaps 26 can be equal to each other (as shown in FIG. 6) or unequal to each other. Alternatively, the protrusion sections 253 can be continuously formed or discontinuously formed. The structure of this embodiment can achieve the same effect as the first embodiment.

Please now refer to FIG. 7 as well as FIG. 2A. FIG. 7 is a sectional view of a sixth embodiment of the fan structure of the present invention. The sixth embodiment is partially identical to the first embodiment in component and relationship between the components and thus will not be repeatedly described hereinafter. The sixth embodiment is mainly different from the first embodiment in that one end of the groove 24 formed on the inner wall face of the annular wall 23 is formed as an upper open end 241, while the other end is formed as a lower closed end 242. The protrusion section 253 correspondingly protrudes between the upper open end 241 and the lower closed end 242. The structure of this embodiment can achieve the same effect as the first embodiment.

Please now refer to FIG. 8 as well as FIG. 2A. FIG. 7 is a sectional view of a seventh embodiment of the fan structure of the present invention. The seventh embodiment is partially identical to the first embodiment in component and relationship between the components and thus will not be repeatedly described hereinafter. The seventh embodiment is mainly different from the first embodiment in that one end of the groove 24 formed on the inner wall face of the annular wall 23 is formed as an upper closed end 243, while the other end is formed as a lower open end 244. The protrusion section 253 correspondingly protrudes between the upper closed end 243 and the lower open end 244. The structure of this embodiment can achieve the same effect as the first embodiment.

Figure 9A:
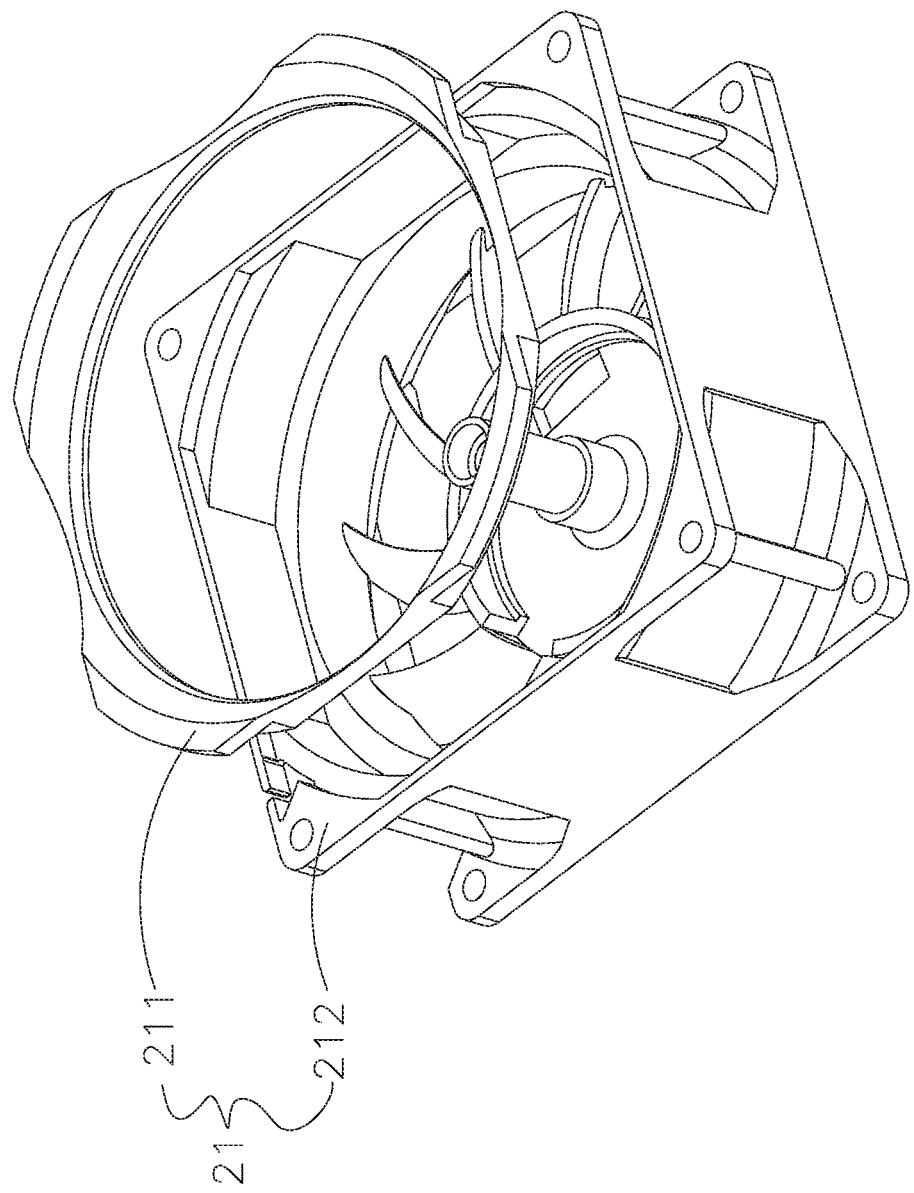
FIG. 9A is a perspective exploded view of an eighth embodiment of the fan structure of the present invention.
Figure 9B:
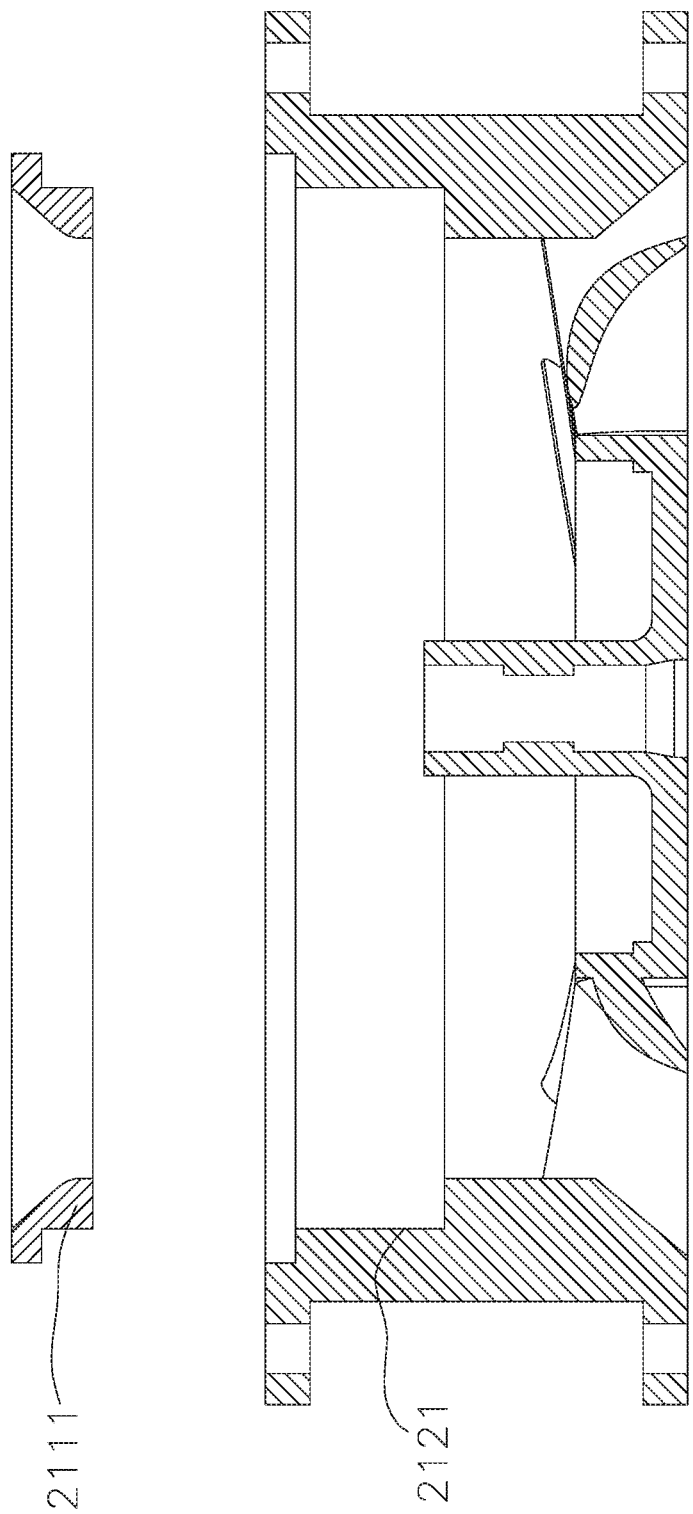
FIG. 9B is a sectional exploded view of the eighth embodiment of the fan structure of the present invention.
Figure 9C:
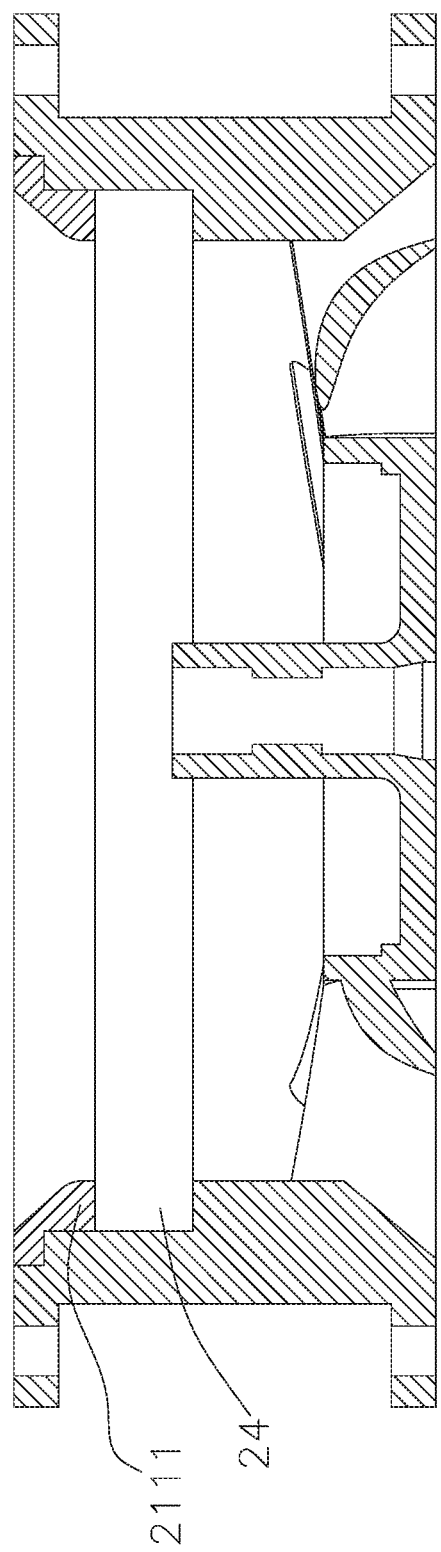
FIG. 9C is a sectional assembled view of the eighth embodiment of the fan structure of the present invention.

Please now refer to FIGS. 9A, 9B and 9C. FIG. 9A is a perspective exploded view of an eighth embodiment of the fan structure of the present invention. FIG. 9B is a sectional exploded view of the eighth embodiment of the fan structure of the present invention. FIG. 9C is a sectional assembled view of the eighth embodiment of the fan structure of the present invention. The eighth embodiment is partially identical to the first embodiment in component and relationship between the components and thus will not be repeatedly described hereinafter. The eighth embodiment is mainly different from the first embodiment in that the frame body 21 has an upper frame 211 and a lower frame 212. An extension section 2111 downward extends from the inner circumference of the upper frame 211. The inner wall face of the lower frame 212 is formed with a recess 2121. The extension section 2111 is correspondingly assembled in the recess 2121 to form the groove 24. In other words, in this embodiment, the groove 24 is not integrally formed, but is formed by means of correspondingly connecting the upper and lower frames 211, 212 with each other. The upper and lower frames 211, 212 are connected by means of adhesion, engagement, latching, locking, interference or any other equivalent. The structure of this embodiment can achieve the same effect as the first embodiment.

Figure 10A:
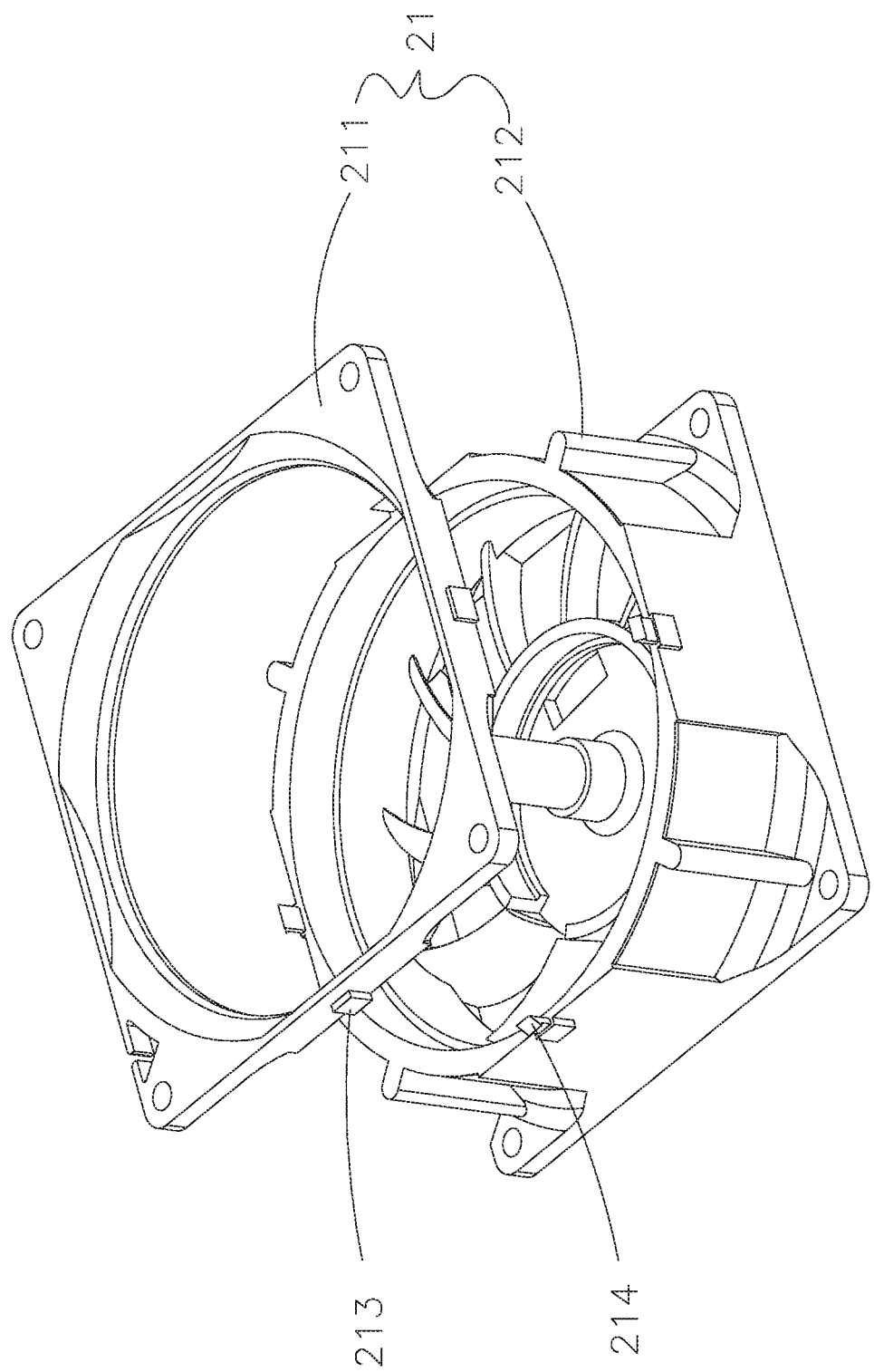
FIG. 10A is a perspective exploded view of a ninth embodiment of the fan structure of the present invention.
Figure 10B:
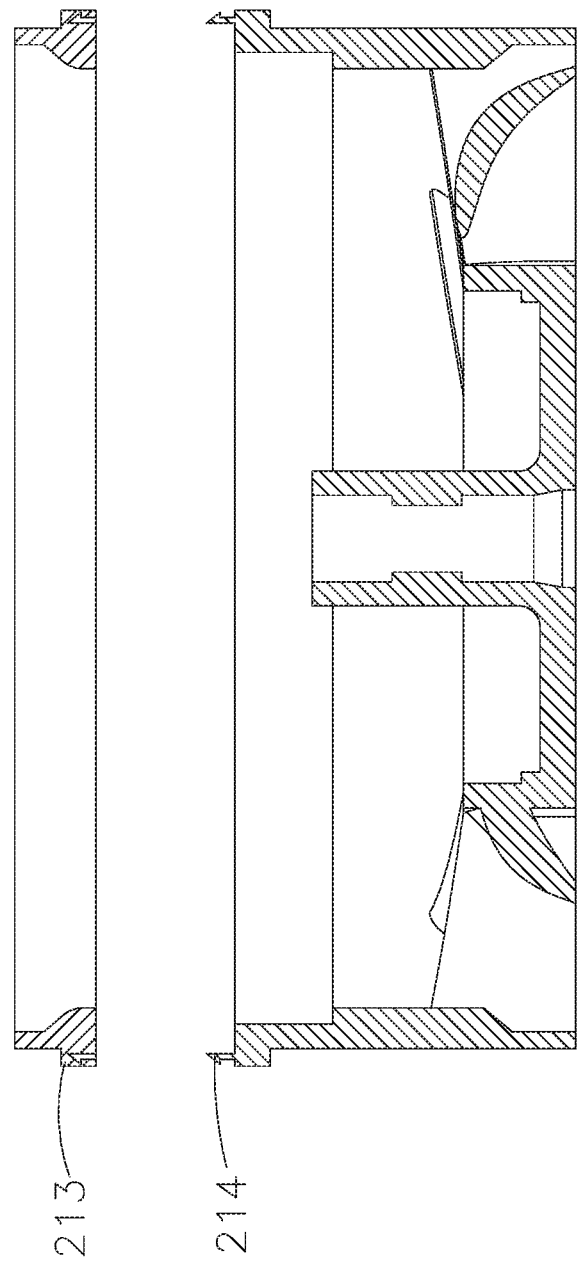
FIG. 10B is a sectional exploded view of the ninth embodiment of the fan structure of the present invention.
Figure 10C:
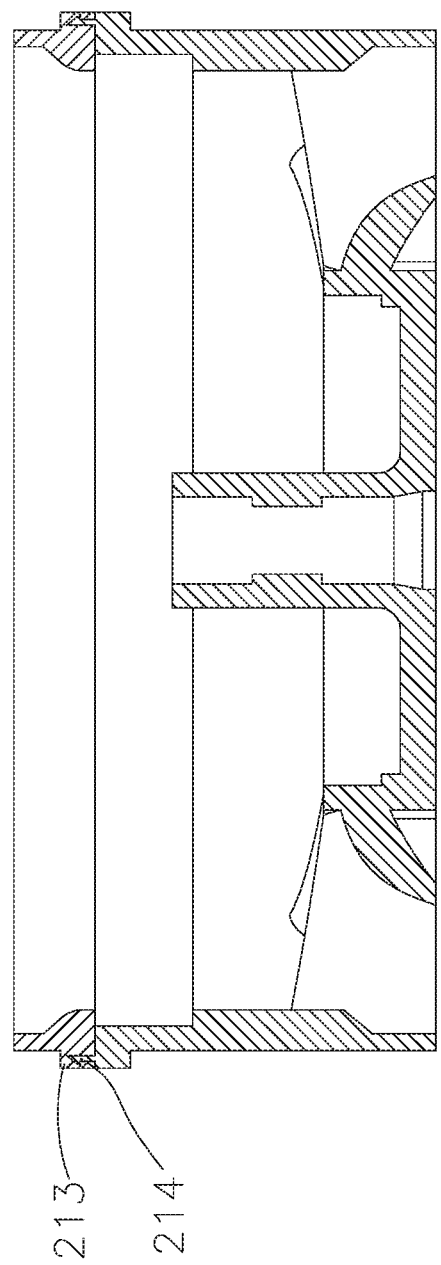
FIG. 10C is a sectional assembled view of the ninth embodiment of the fan structure of the present invention.

Please now refer to FIGS. 10A, 10B and 10C. FIG. 9A is a perspective exploded view of a ninth embodiment of the fan structure of the present invention. FIG. 9B is a sectional exploded view of the ninth embodiment of the fan structure of the present invention. FIG. 9C is a sectional assembled view of the ninth embodiment of the fan structure of the present invention. The ninth embodiment is partially identical to the first embodiment in component and relationship between the components and thus will not be repeatedly described hereinafter. The ninth embodiment is mainly different from the first embodiment in that the outer wall face of the upper frame 211 has multiple latch sections 213. The outer wall face of the lower frame 212 has multiple hook sections 214. The latch sections 213 are correspondingly latched with the hook sections 214. The structure of this embodiment can achieve the same effect as the first embodiment.

In conclusion, in comparison with the conventional fan structure, the present invention has the following advantages:

1. The strength of the vortex is greatly minified.
2. The structure of the sound field of the vortex is changed.
3. The noise of the entire fan structure is greatly lowered.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A fan structure comprising:
    a frame body formed of an upper frame and a lower frame and having a base seat and an annular wall, the upper and lower frames connected with each other to form a circumferential groove on an inner wall face of the annular wall,
    a bearing cup extending upwardly from a center of the base seat; and
    a fan impeller pivotally disposed on the bearing cup, the fan impeller having a central hub and multiple blades, each blade extending radially outward from a circumference of the central hub and having a tip extending into the circumferential groove, wherein the tip of each blade has a leading section, a middle section, and a trailing section and wherein each blade has two outwardly extending steps which are formed on the leading section and on the trailing section, respectively, and wherein the middle section steps inwardly.

2. The fan structure as claimed in claim 1, wherein a gap is defined between each two steps of each blade.

3. The fan structure as claimed in claim 1, wherein the circumferential groove is formed with an upper open end and a lower closed end, the blade tips correspondingly protruding between the upper open end and the lower closed end.

4. The fan structure as claimed in claim 1, wherein the circumferential groove is formed with an upper closed end and a lower open end, the blade tips correspondingly protruding between the upper closed end and the lower open end.

5. The fan structure as claimed in claim 1, wherein an extension section extends downwardly from an inner circumference of the upper frame, an inner wall face of the lower frame being formed with a recess, the extension section being correspondingly assembled in the recess to form the circumferential groove.

6. The fan structure as claimed in claim 5, wherein the upper and lower frames are connected with each other by means of adhesion, engagement, latching, locking or interference.

7. The fan structure as claimed in claim 5, wherein an outer wall face of the upper frame has multiple latch sections and an outer wall face of the lower frame has multiple hook sections, the latch sections being correspondingly latched with the hook sections.

8. The fan structure of claim 1, wherein the stepped tip profile differs among the multiple blades.

\* \* \* \* \*